United States Patent
Noguchi et al.

(10) Patent No.: US 11,854,617 B2
(45) Date of Patent: *Dec. 26, 2023

(54) STRUCTURE FOR MULTIPLE SENSE AMPLIFIERS OF MEMORY DEVICE

(71) Applicant: TAIWAN SEMICONDUCTOR MANUFACTURING COMPANY, LTD., Hsinchu (TW)

(72) Inventors: Hiroki Noguchi, Hsinchu (TW); Ku-Feng Lin, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,707

(22) Filed: Jan. 19, 2023

(65) Prior Publication Data

US 2023/0154533 A1   May 18, 2023

Related U.S. Application Data

(63) Continuation of application No. 17/185,189, filed on Feb. 25, 2021, now Pat. No. 11,574,676.

(51) Int. Cl.
  *G11C 11/00* (2006.01)
  *G11C 13/00* (2006.01)

(52) U.S. Cl.
  CPC ........ *G11C 13/004* (2013.01); *G11C 13/0026* (2013.01); *G11C 2013/0045* (2013.01); *G11C 2013/0054* (2013.01); *G11C 2213/79* (2013.01)

(58) Field of Classification Search
  CPC .............. G11C 13/004; G11C 13/0026; G11C 13/0045; G11C 13/0054
  USPC .......................................................... 365/148
  See application file for complete search history.

(56) References Cited

U.S. PATENT DOCUMENTS

| | | | |
|---|---|---|---|
| 5,287,318 A | 2/1994 | Kuki et al. | |
| 8,085,611 B2 | 12/2011 | Lin et al. | |
| 2015/0143020 A1 | 5/2015 | Ferreira et al. | |
| 2015/0170730 A1* | 6/2015 | Antonyan | G11C 11/4091 365/189.07 |
| 2017/0309330 A1 | 10/2017 | Pyo | |
| 2018/0336953 A1* | 11/2018 | Miyazaki | G11C 11/5642 |
| 2019/0348096 A1 | 11/2019 | Antonyan et al. | |
| 2021/0012821 A1 | 1/2021 | Ramanan et al. | |

OTHER PUBLICATIONS

Shih et al., "Logic Process Compatible 40-nm 16-Mb, Embedded Perpendicular-MRAM With Hybrid-Resistance Reference, Sub-µA Sensing Resolution, and 17.5-nS Read Access Time", IEEE Journal of Solid-State Circuits, vol. 54, No. 4, Apr. 2019, pp. 1029-1038.

\* cited by examiner

*Primary Examiner* — Vu A Le
(74) *Attorney, Agent, or Firm* — Birch, Stewart, Kolasch & Birch, LLP

(57) ABSTRACT

A memory device is provided. The memory device includes several sense amplifiers and at least one reference cell. Each of the sense amplifiers has a first terminal and a second terminal. The first terminals of the sense amplifiers are coupled to a memory cell block, and the second terminals of the sense amplifiers are coupled together to transmit a read current. The at least one reference cell transmits the read current to a ground terminal. The at least one reference cell has a decreased resistance value when a number N of the sense amplifiers increases.

20 Claims, 9 Drawing Sheets

STRUCTURE FOR MULTIPLE SENSE AMPLIFIERS OF MEMORY DEVICE

RELATED APPLICATIONS

This application is a continuation of U.S. application Ser. No. 17/185,189, filed on Feb. 25, 2021, which is herein incorporated by reference.

BACKGROUND

Resistive based memory devices (ReRAMs), such as magnetic random access memory (MRAM), phase changeable random access memory (PRAM), resistance random access memory (RRAM), etc. can store data by programming the resistance of cells included therein. For example, an MRAM can store a logical data value of "zero" by programming a data cell to have a relatively low resistance or can store a logical data value of "one" by programming the data cell to have a relatively high resistance. In order to read out the stored data, external reference cells are necessary for generating reference currents to be compared with cell currents by sense amplifiers. However, reference cells have large uncontrollable variation, and it leads to large read error rate essentially.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
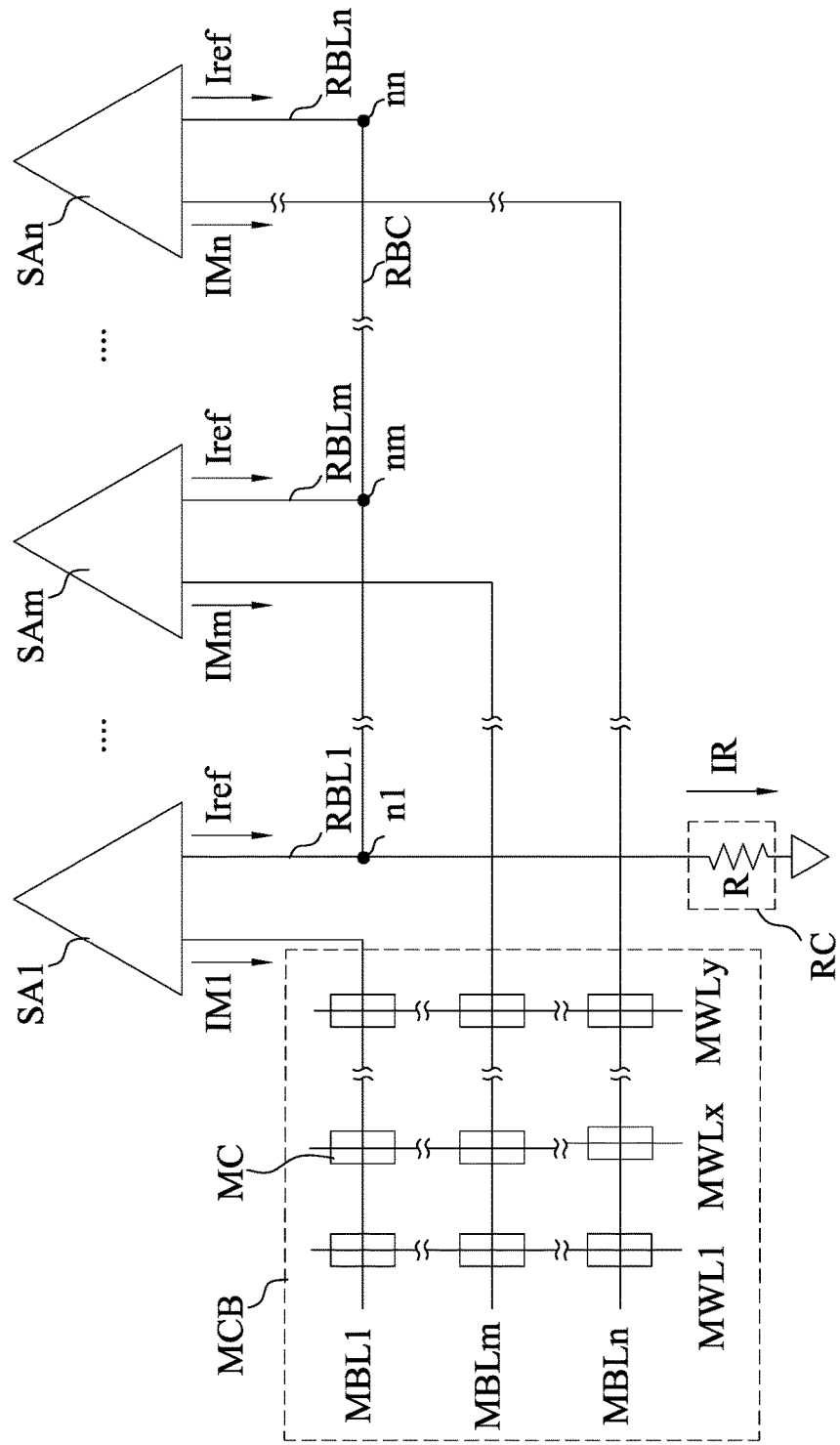
FIG. 1 is a schematic diagram of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Recently, some embedded non-volatile emerging memory has been proposed to replace conventional SRAM, eDRAM and eFlash with smaller energy and area in advanced technology node. In structure of sense amplifier in memory, all of 1T1R type resistive memory (ReRAM, MRAM, PCRAM and so on) need an external reference cell to compare current values for reading out the data in the resistive memories. Alternatively stated, the reference cells are essentially required for all of resistive memories to readout the resistant states by the sense amplifiers. However, the reference cells have large uncontrollable variation, which leads to large read error rate essentially. For instance, factors including, manufacture process, device structures, materials, etc., contribute the variations of the reference cells. Moreover, because of the existence of the fluctuations in the currents flowing through the accessed resistive memory cell (i.e., Icell(L) and Icell(H)) and reference cell (i.e., Iref), trimming code needs to be different among sense amplifiers. In addition, during a read operation of the sense amplifiers, each of the sense amplifiers latches H (logic high) or L (logic low) in accordance with readout data at different timing. Accordingly, the reference currents behave differently among the sense amplifiers.

In the present disclosure memory structures for reducing the reference current variation of the reference cells in sense amplifiers are provided. For example, in some embodiments, terminals of the sense amplifiers for coupling a reference cell are coupled together and all currents flowing through the terminal pass the same reference cell in current sensing read operation. Alternatively stated, current paths for transmitting the currents flowing through the reference cells are merged. In another embodiment, each sense amplifier couples a reference cell and the terminals of the sense amplifiers for coupling a reference cell are coupled together in voltage sensing read operation. In yet another embodiment, multiplexers for selecting one of the reference cells is implemented. In the other embodiments, the combinations of the configurations mentioned above are implements. Alternatively stated, multiple choices of the reference cells are provided for the memory structure to achieve the smallest variation of the reference cells. In some embodiments, IO-to-IO variations and the integrated circuit area are reduced at the same time, and correspondingly, read window is increased a lot.

Reference is now made to FIG. 1. FIG. 1 is a schematic diagram of a memory device 100 in accordance with various embodiments of the present disclosure. For illustration, the memory device 100 includes n sense amplifiers SA1-SAn, a memory cell block MCB, and a reference cell RC, in which n is a number of the sense amplifiers included in the memory device 100 and is a positive integer. In some embodiments, the memory cell block MCB includes columns of memory cells MC coupled to multiple data lines MBL1-MBLn.

For illustration, the memory cells in the same memory column are coupled to the same date line of the data line MBL1-MBLn. The memory cells in the same row are coupled to the same word line of word lines MWL1-NWLy, in which n denotes a number of the memory cells MC arranged in one memory column. In some embodiments, a row decoder/driver (not shown) is coupled to the memory block MCB via the word lines MWL1-NWLy. The row decoder/driver decodes a row address of the memory cells MC selected to be accessed in a read operation or a write operation. In various embodiments, a column decoder/driver (not shown) decodes a column address of the memory cells MC selected to be accessed in a read operation or a write operation. The column decoder/driver then enables, via a multiplexer (not shown in FIG. 1), the data line corresponding to the decoded row address to permit access to the selected memory cells MC.

As shown in FIG. 1, the sense amplifier SA1 has a first terminal coupled with the data line MBL1 and a second terminal coupled with the reference cell RC at a node n1 through a data line RBL1. A sense amplifier SAm including in the n sense amplifiers has a first terminal coupled with a data line MBLm included in the n data lines and a second terminal coupled to the second terminals of the sense amplifier SA1-SA(m−1) at a node nm through a data line RBLm. In some embodiments, m is a positive integer smaller than n. The sense amplifier SAn has a first terminal coupled to the data line MBLn and a second terminal coupled to the sense amplifiers SA1-SA(n−1) and the reference cell RC through a data line RBLn at a node nn. Alternatively stated, the second terminals of the sense amplifiers SA1-SAn included in the memory device 100 are coupled together through a conductive line RBC and further coupled to the reference cell RC at the node n1, while the reference cell RC is coupled between the node n1 and a ground.

In some embodiments, the data lines MBL1-MBLn are referred to as bit lines for facilitating reading from and/or writing to accessed memory cells MC in the memory block MCB. In various embodiments, the data lines RBL1-RBLn are referred to as reference bit lines.

In some embodiments, the memory cells MC include volatile memory cells which do not retain data after removal of power supply, or non-volatile memory cells which retain data after removal of power supply. Examples of volatile memory cells include, but are not limited to, static random access memory (SRAM) cells, dynamic random access memory (DRAM) cells etc. Examples of volatile memory cells include, but are not limited to, read-only memory (ROM) cells, electrically erasable programmable ROM (EEPROM) cells, flash memory cells etc. In one or more embodiments, the memory cells MC include single-level memory cells each of which is configured to store 1 bit of data, or multi-level memory cells each of which is configured to store 2 or more bits of data.

In some embodiments, each one of the sense amplifiers SA1-SAn is configured to compare a first signal and a second signal that are received separately at a first terminal and a second terminal of each of the sense amplifiers SA1-SAn. Specifically, in some embodiments, each one of the sense amplifiers SA1-SAn is configured to detect the logic state of the data stored in the memory cell MC based on a cell current at the first terminal and a reference current at the second terminal of each of the sense amplifiers SA1-SAn. The cell current flowing through a memory cell MC when the memory cell is accessed in a read operation depends on a logic state of data stored in the memory cell MC. The reference cell RC is configured, e.g., by appropriate programming, to have the predetermined reference current. Accordingly, by detecting and comparing the predetermined reference current of the reference cell RC and the cell current of the memory cell MC, the logic state of the data stored in the memory cell MC is determined. For example, in the read operation, the sense amplifier SA1 compares the cell current IM1 with the reference current Iref to determine a logic state of the selected memory cell RC coupled to the data line MBL1. The configurations of the rest of the sense amplifiers in the memory device 100 are similar to that of the sense amplifier SA1, and thus, the repetitious descriptions are omitted here.

In some embodiments, the reference currents Iref have substantially the same value. As shown in FIG. 1, the reference currents Iref flowing from the sense amplifiers SA1-SAn pass through the reference cell and are merged together as a current IR. The reference cell RC includes a resistive element R. Accordingly, the current IR flows through the resistive element R.

Furthermore, in some embodiments, the resistance value of the resistive element R is associated with the number n of the sense amplifiers SA1-SAn, a first resistance value r1 and a second resistance value r2 of each of the memory cells MC. For example, each of the memory cells MC has a high resistance state and a low resistance state that are interchangeable based on a write operation performed thereon. For illustration, the resistance of each of the memory cells MC under the high resistance state, which is also referred to as high state resistance (i.e., first resistance value r1) is higher than its resistance under the low resistance state, which is also referred to as low state resistance (i.e., second resistance value r2). In operation, the resistance state of the memory cells MC is modified by a write current applied thereon. In some approaches, a resistance value of a resistive element is often predetermined by a median value of the high state resistance and the low state resistance, while each sense amplifier implemented in those approaches couples to an individual resistive element. With the configurations of the present disclosure, as mentioned above, while the second outputs of all the sense amplifiers are coupled together, the current IR experienced by the resistive element R is substantially equal to n x Iref (i.e., the number of the sense amplifiers n times the reference current Iref.) Accordingly, the required resistance is reduced and predetermined by (r1+r2)/2n.

Specifically, for example, in some approaches, a resistive element is only coupled to a sense amplifier, and correspondingly, the resistive element has a relative high resistance value of about 7000 ohms. Accordingly, in such arrangements, when a memory device includes many resistive elements and sense amplifiers as discussed above in those approaches, those resistive elements contribute large variations and occupy great areas in the memory device. In contrast, with the configurations of the present disclosure, for example, in some embodiments, there are 2 sense amplifiers coupled together, and correspondingly the resistive element R is determined as about 3500 ohms. In another embodiment, there are 8 sense amplifiers coupled together, and correspondingly the resistive element R is determined as about 875 ohms. In yet another embodiment, there are 16 sense amplifiers coupled together, and correspondingly the resistive element R is determined as about 437.5 ohms. In still another embodiment, there are 32 sense amplifiers coupled together, and correspondingly the resistive element R is determined as about 218.75 ohms. Accordingly, by implementing the configurations of FIG. 1, only one resistive element R is needed, and correspondingly the variation of the resistive element and the area occupied by the resistive element are reduced, compared with some approaches.

The configurations of FIG. 1 are given for illustrative purposes. Various implements are within the contemplated scope of the present disclosures. For example, in some embodiments, the reference cell RC is coupled to the sense amplifiers SA1-SAn at the node nn.

Figure 2:
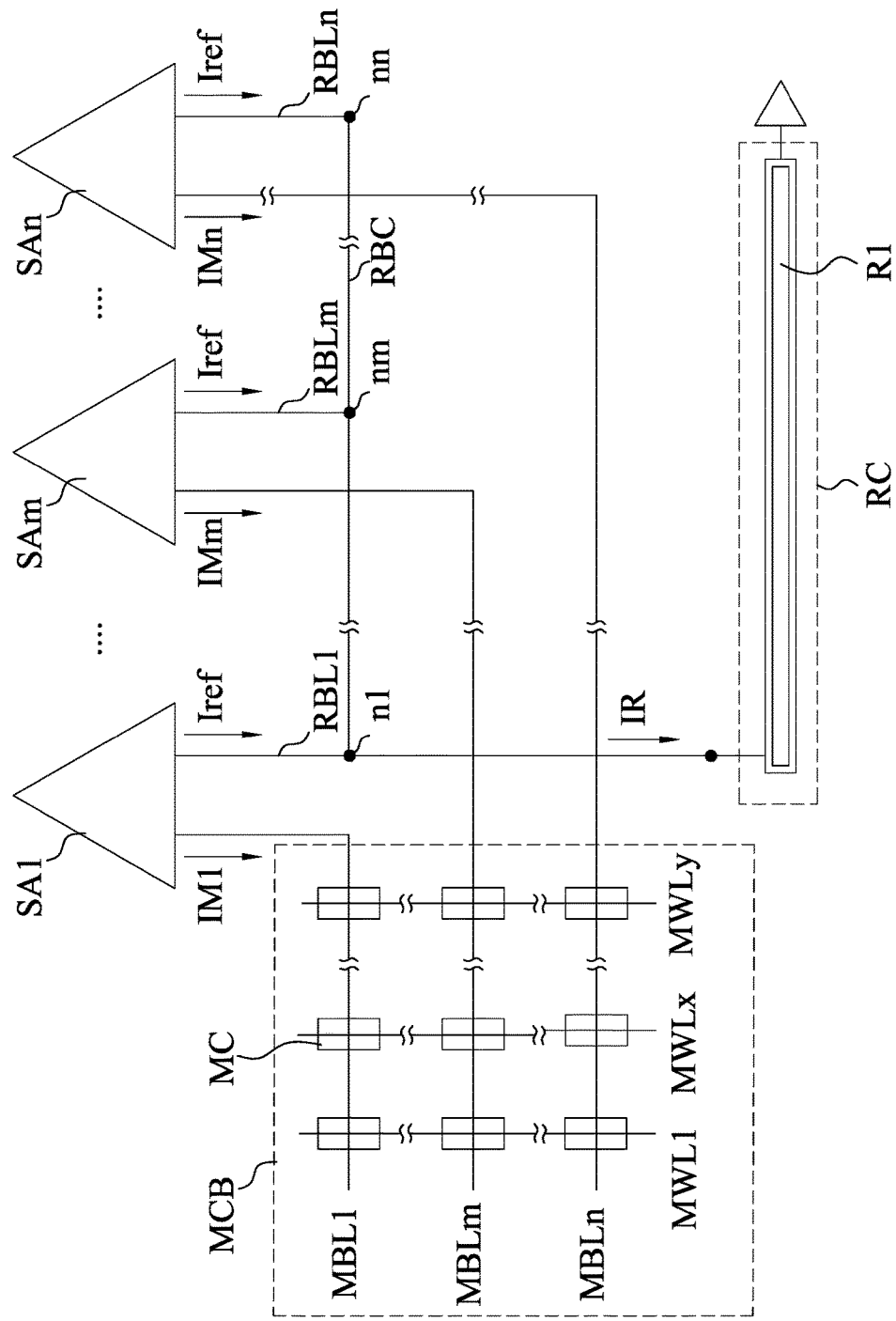
FIG. 2 is a schematic diagram of the memory device in accordance with other embodiments of the present disclosure.

Reference is now made to FIG. 2. FIG. 2 is a schematic diagram of the memory device 100 in accordance with other embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2.

Compared with FIG. 1, the reference cell RC further includes a resistive element R1. As illustratively shown in FIG. 2, the resistive element R1 extends along the arrangement of the sense amplifiers SA1-SAn. Alternatively stated, the resistive element R1 is not bending and drawn in n pitches of the sense amplifiers SA1-SAn. In some embodiments, as shown in FIG. 2, the resistive element R1 is arranged parallel to the conductive line RBC coupling the second terminals of the sense amplifiers SA1-SAn.

In some approaches, like element of the resistive element R1 is arranged in a sense amplifier pitch. However, it's difficult to implement the arrangement when the resistance value of the resistive element is large. With the configurations of the present disclosure, the flexibility of arranging the resistive cell RC in the memory device 100 is improved due to smaller resistance value of the resistive element R1 and the structure of the resistive element R1, compared with some approaches. In addition, even the resistive element R1 in the reference cell RC has a large resistance value, by utilizing the structure illustrated in FIG. 2, the reference cell RC is implemented in a reasonable area and shared for the sense amplifiers SA1-SAn.

The configurations of FIG. 2 are given for illustrative purposes. Various implements are within the contemplated scope of the present disclosures. For example, in some embodiments, the resistive element R1 extends in fewer pitches of the sense amplifiers, compared with FIG. 2.

Figure 3:
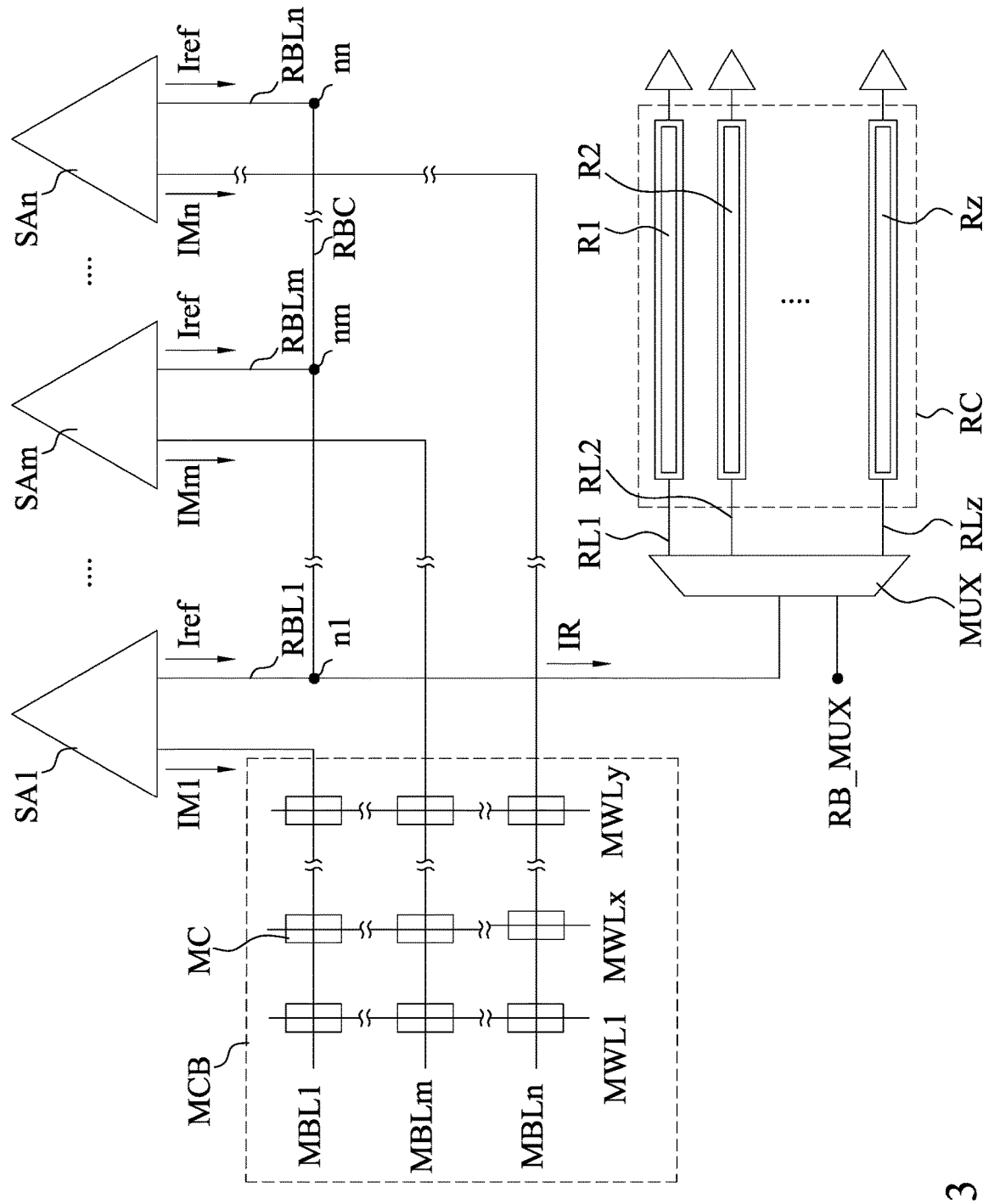
FIG. 3 is a schematic diagram of the memory device in accordance with other embodiments of the present disclosure.

Reference is now made to FIG. 3. FIG. 3 is a schematic diagram of the memory device 100 in accordance with other embodiments of the present disclosure. With respect to the embodiments of FIGS. 1-2, like elements in FIG. 3 are designated with the same reference numbers for ease of understanding.

Compared with FIGS. 1-2, the memory device 100 further includes a multiplexer MUX, and the reference cell RC includes resistive elements R1-Rz coupled to the multiplexer MUX through data lines RL1-RLz. In some embodiments, the resistive elements R1-Rz are referred to as separated reference cells included in the reference cell RC. As illustratively shown in FIG. 3, a terminal of the multiplexer MUX is coupled to the second terminals of the sense amplifiers SA1-SAn. In some embodiments, the resistive elements R1-Rz are configured with respect to, for example, the resistive element R1 of FIG. 2. Alternatively stated, the multiplexer MUX is coupled between the resistive elements R1-Rz and the sense amplifiers SA1-SAn.

For illustration, the multiplexer MUX is configured to pass, in response to a select signal RB_MUX, currents (i.e., the summed current IR in FIG. 3) provided to the sense amplifiers SA1-SAn to flow through one of the resistive elements R1-Rz. Alternatively stated, the multiplexer MUX is configured to couple, in response to the select signal RB_MUX, one of the data line RL1-RLz to the data line RBL1.

In some embodiments, each one of the resistive elements R1-Rz has a resistance value which substantially equals to (r1+r2)/2n. However, there are variations among the resistive elements R1-Rz. Accordingly, a control circuit (not shown, having similar configurations of a control circuit 820 in FIG. 8) is configured to generate the select signal RB_MUX based on the resistance values of the resistive elements R1-Rz for the multiplexer MUX to select one of the resistive elements R1-Rz. In some embodiments, the selected resistive element has a resistance value which is the closest to the value of (r1+r2)/2n.

With the configurations of FIG. 3, one having ordinary skill in the art is able to choose a desired resistive element after the reference cell RC is manufactured, and the number of choices is a number of the resistive elements included in the reference cell RC. Accordingly, utilizing multiple choices provided by the reference cell RC reduces the resistance variation.

The configurations of FIG. 3 are given for illustrative purposes. Various implements are within the contemplated scope of the present disclosure. For example, in some embodiments, rather than being selected due to the closest resistance value to the value of (r1+r2)/2n, the selected resistive element is chosen for other reason in the applications.

Figure 4:
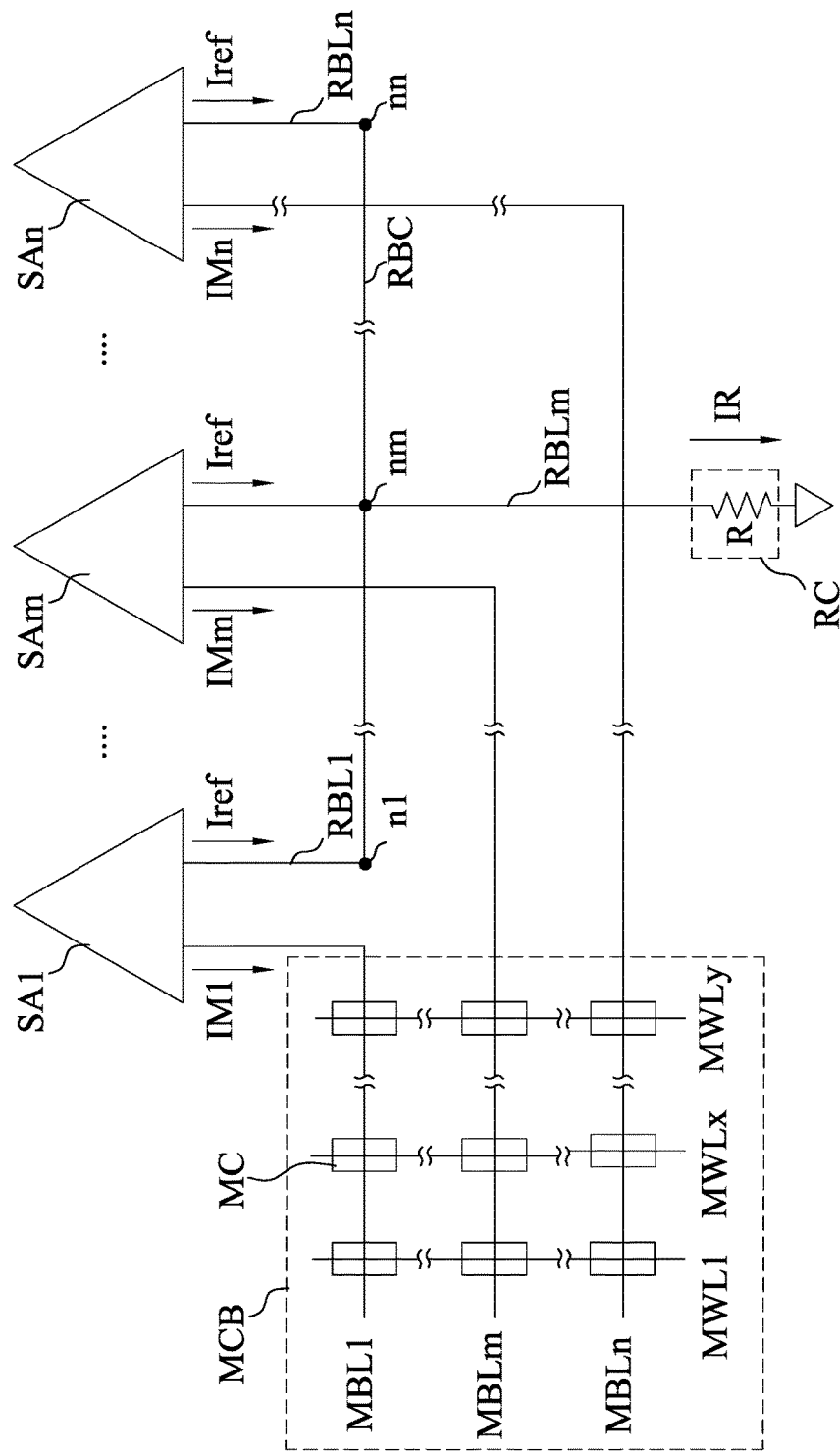
FIG. 4 is a schematic diagram of the memory device in accordance with other embodiments of the present disclosure.

Reference is now made to FIG. 4. FIG. 4 is a schematic diagram of the memory device 100 in accordance with other embodiments of the present disclosure. With respect to the embodiments of FIGS. 1-3, like elements in FIG. 4 are designated with the same reference numbers for ease of understanding.

Compared with FIG. 1, instead of coupling the reference cell RC at the node n1, the reference cell RC is coupled to the second terminals of the sense amplifiers SA1-SAn at the node nm through the data line RBLm. In some embodiments, m equals to a median from 1 to n. Accordingly, the resistance variations resulted from different lengths of the data lines RBL1-RBLn for the reference currents Iref are reduced.

Figure 5:
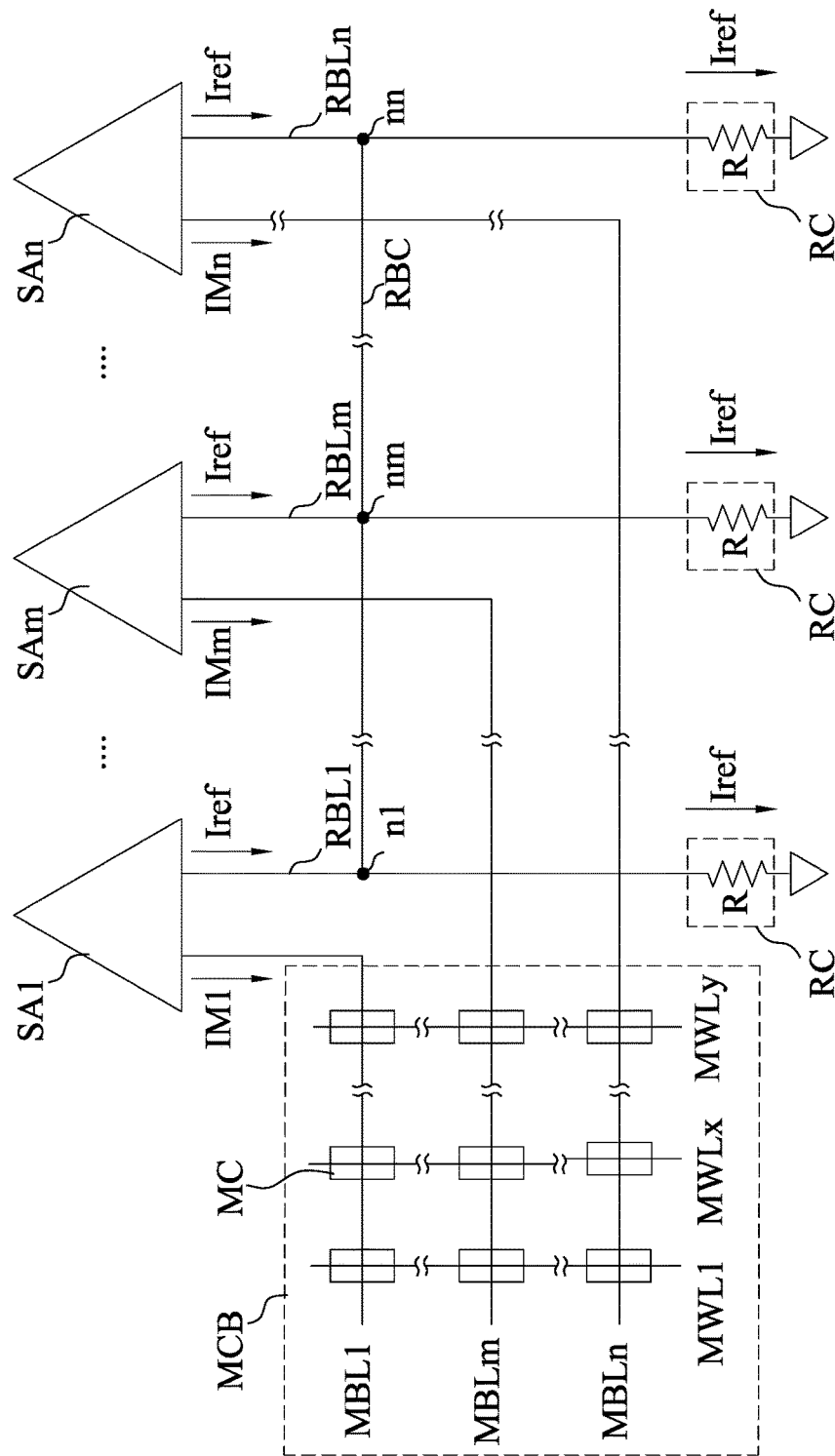
FIG. 5 is a schematic diagram of a memory device in accordance with various embodiments of the present disclosure.

Reference is now made to FIG. 5. FIG. 5 is a schematic diagram of a memory device 500 in accordance with other embodiments of the present disclosure. With respect to the embodiments of FIGS. 1-4, like elements in FIG. 5 are designated with the same reference numbers for ease of understanding.

Compared with FIG. 1, the memory device 500 further includes multiple reference cells RC. As illustratively shown in FIG. 5, each one of the sense amplifiers SA1-SAn are coupled to the reference cells RC through the data lines RBL1-RBLn, and the data lines RBL1-RBLn are coupled together through the conductive line RBC. Alternatively stated, the second terminals of the sense amplifiers SA1-SAn are coupled together (i.e., merged voltage node of the sense amplifiers) and each of the second terminals of the sense amplifiers SA1-SAn is coupled to one of the reference cells RC.

With the configurations of the present disclosure, the resistance variation of the reference cells RC is reduced. The relationship of the resistance variation of the reference cells RC for 1σ and the number of merged reference cells RC is illustrated as table I below:

TABLE I

| the resistance variation and the number of merged reference cells | | | | | | | |
|---|---|---|---|---|---|---|---|
| # of merge | 1 | 2 | 4 | 8 | 16 | 32 | 64 | 128 |
| 1σ variation | 5.00% | 3.54% | 2.50% | 1.77% | 1.25% | 0.88% | 0.63% | 0.44% |

For example, in some approaches, the resistance variation of reference cells is about 5.00%, when the reference cells are not electrically coupled with each other. In the embodiments shown in table I, with the configurations of the present disclosure, when 2 reference cells RC are coupled together, the resistance variation of the reference cells RC is about 3.54%. When 8 reference cells RC are coupled together, the resistance variation of the reference cells RC is about 1.77%. When 32 reference cells RC are coupled together, the resistance variation of the reference cells RC is about 0.88%. When 128 reference cells RC are coupled together, the resistance variation of the reference cells RC is about 0.44%. Alternatively stated, the more the reference cells merge with each other, the greater the reduction of the resistance variation is. Based on the discussion above, the resistance variation of the reference cells RC is reduce.

The configurations of FIG. 5 are given for illustrative purposes. Various implements are within the contemplated scope of the present disclosure. For example, in some embodiments, due to the small variation of the reference cells, the reference cells are implemented by cells the same as the memory cell MC. Alternatively stated, no specific resistive element (i.e., one having high resistance value) is needed.

Figure 6:
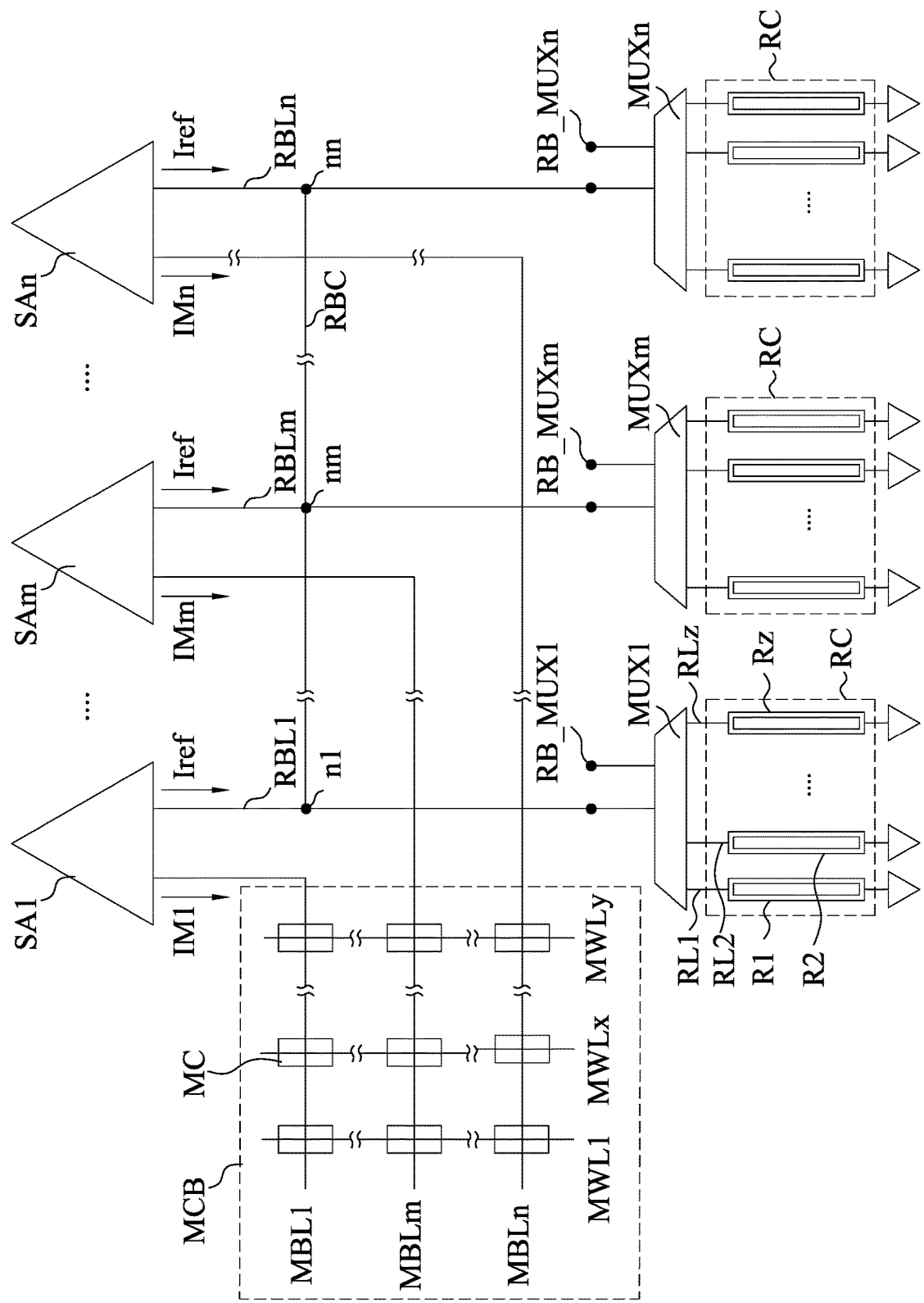
FIG. 6 is a schematic diagram of the memory device in accordance with other embodiments of the present disclosure.

Reference is now made to FIG. 6. FIG. 6 is a schematic diagram of the memory device 500 in accordance with other embodiments of the present disclosure. With respect to the embodiments of FIGS. 1-5, like elements in FIG. 6 are designated with the same reference numbers for ease of understanding.

Compared with FIG. 5, instead of coupling the reference cells RC to the sense amplifiers SA1-SAn directly, the memory device 500 further includes multiple multiplexers MUX1-MUXn. In some embodiments, the multiplexers MUX1-MUXn are configured with respect to, for example, the multiplexer MUX of FIG. 3. The reference cells RC are configured with respect to, for example, the reference cell RC of FIG. 3.

For illustration, terminals of the multiplexers MUX1-MUXn are coupled to the second terminals of the sense amplifiers SA1-SAn. The multiplexers MUX1-MUXn are coupled between the reference cells RC and the sense amplifiers SA1-SAn.

Each of the multiplexers MUX1-MUXn is configured to pass, in response to one of select signals RB_MUX1-RB_MUX1n, one of the reference currents Iref provided to one of the sense amplifiers SA1-SAn to flow through one of the resistive elements R1-Rz in the reference cell RC. Alternatively stated, each of the multiplexers MUX1-MUXn is configured to couple, in response to one of the select signal RB_MUX1-RB_MUXn, one of the data line RL1-RLz in the reference cell RC to one of the data lines RBL1-RBLn. For example, as shown in FIG. 6, the multiplexer MUX1 is coupled to the sense amplifier SA1 through the data line RBL1. The multiplexer MUX1 couples one of the resistive elements R1-Rz in the reference cell RC coupled thereto in response to the select signal RB_MUX1. Alternatively stated, the multiplexer MUX1 couples one of the data lines RL1-RLz to the data line RBL1. The configurations of the rest multiplexers in the memory device 500 are similar to that of the multiplexer MUX1. Therefore, the repetitious descriptions are omitted here.

In some embodiments, the variation of the reference currents Iref is associated with the resistance variation of the reference cells RC (i.e., the selected resistive elements in different reference cells RC). Accordingly, the select signals RB_MUX1-RB_MUXn are generated by a control circuit (not shown, having similar configurations of the control circuit 820 of FIG. 8) based on the reference values of the resistive elements R1-Rz in all reference cells RC, in order to gain the minimum variation of all selected resistive elements.

The configurations of FIG. 6 are given for illustrative purposes. Various implements are within the contemplated scope of the present disclosure. For example, in some embodiments, the resistive elements RL1-RLz are implemented by cells the same as the memory cells MC.

Figure 7:
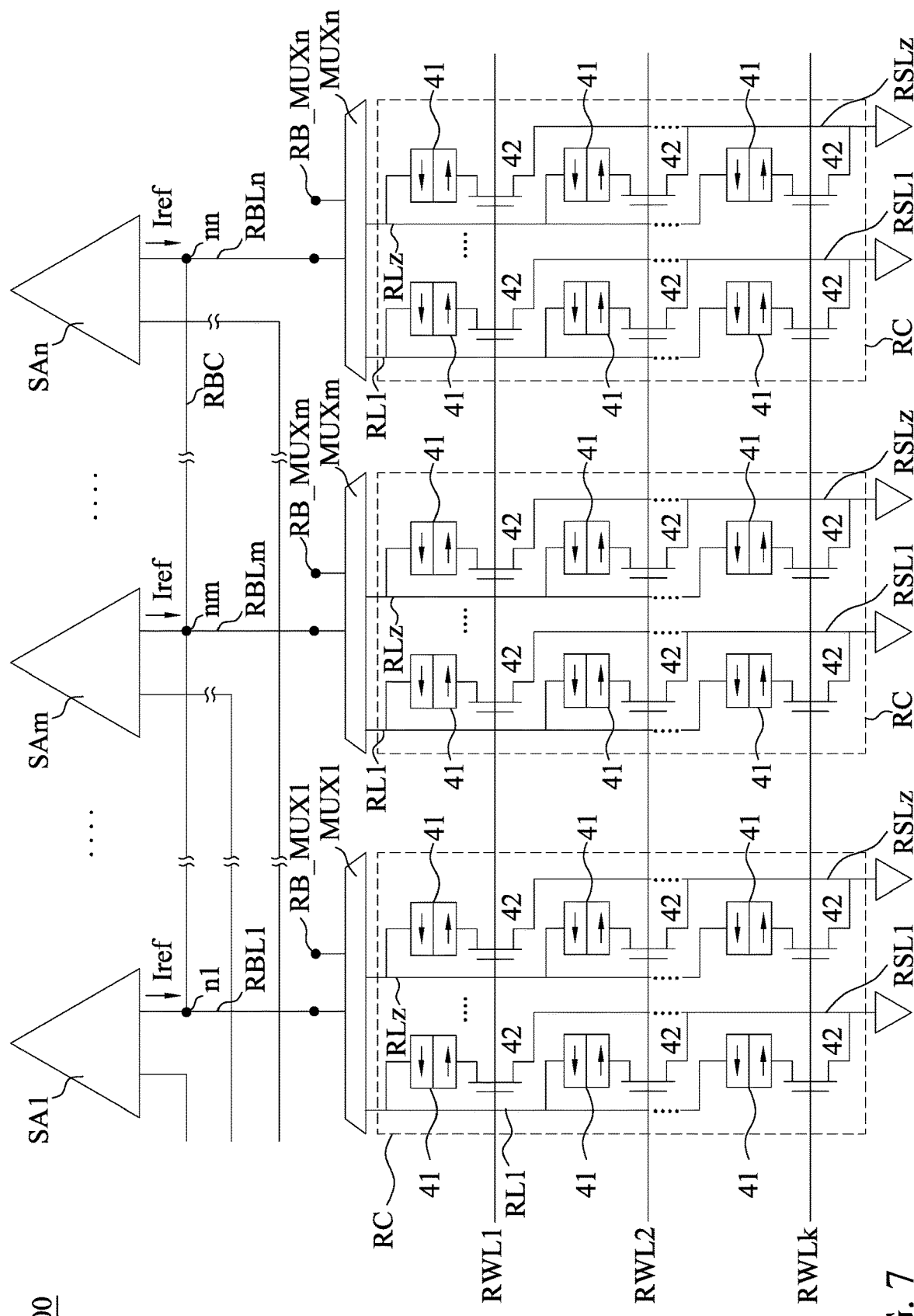
FIG. 7 is a schematic diagram of the memory device in accordance with other embodiments of the present disclosure.

Reference is now made to FIG. 7. FIG. 7 is a detailed schematic diagram of the memory device 500 in accordance with other embodiments of the present disclosure. With respect to the embodiments of FIGS. 1-6, like elements in FIG. 7 are designated with the same reference numbers for ease of understanding. For the sake of simplicity, the memory block MCB is not shown in FIG. 7.

As illustratively shown in FIG. 7, the reference cells RC further include multiple arrays of magnetic tunnel junction (MTJ) memory cell (MTJ cells) 41 and switches 42. In some embodiments, for example, one of the MTJ cells coupled between a pair of a data line RL1 and a data line RSL1 corresponds to the resistive element R1 in FIG. 6, and one of the MTJ cells coupled between a pair of a data line RLz and a data line RSLz corresponds to the resistive element Rz in FIG. 6, and so on. In some embodiments, the data lines RSL1-RSLz are referred to as source lines.

For illustration, as shown in FIG. 7, a first terminal of the MTJ cell 41 is coupled to one of data lines RL1-RLz, and a second terminal of the MTJ cell 41 is coupled to one of the date line RSL1-RSLz through the switch 42. Accordingly, the MTJ cells 41 in same array couple to same pair of one of data lines RL1-RLz and one of the date line RSL1-RSLz.

In some embodiments, each of the MTJ cells 41 has two magnetic layers sandwiched around a magnetic terminal junction of magnesium oxide or the like, and includes a fixed or "pinned" magnetic layer having a permanent magnetic field orientation, and a changeable or "free" magnetic layer having an orientation that can be switched during write operations either to align with the orientation of the fixed layer or to be directly opposite. The magnetic state of the MTJ cell 41 is set by application of a write current of appropriate amplitude and polarity, or read out by application of a read current (i.e., the reference current Iref) to apply a voltage to the sense amplifier, which the voltage is higher or lower in the different resistance states of the cell. The read operation require the switch 42 to couple the MTJ cell to the second terminal of the sense amplifier, along the data line (i.e., RL1) for that MTJ cell position.

With continued reference to FIG. 7, the switches 42 are coupled to reference word lines RWL1-RWLk at their gate terminals. In some embodiments, one of the reference word lines RWL1-RWLk is selected at a time, by application of an enabling voltage, whereupon all the MTJ cells along that word line are coupled between their associated the data line and source line.

In read operation, for example, in some embodiments, the multiplexers MUX1-MUXn select one of the data lines RL1-RLz in each reference cell RC in response to the select signals MUX1-MUXn. In response to reference word line signals (not shown, having features similar to the reference word line signals RWLS in FIG. 8) on the reference word lines RWL1-RWLk, the switches 42 in the selected memory word are turned on to couple its corresponding MTJ cell to the selected one of the data lines RL1-RLz. Accordingly, a desired MTJ cell in the reference cell RC is selected. In some embodiments, the reference word line signals are generated by a control circuit (not shown, having features similar to that of the control circuit 820 of FIG. 8).

Based on the discussions above, one having ordinary skill in the art is able to choose a desired MTJ cell after the MTJ cells are manufactured. The number of choices is the product of a number of the reference word lines RWL1-RWLk and a number of the data lines RL1-RLz. Accordingly, utilizing multiple choices provided by the reference cells RC reduces the resistance variation. Furthermore, in some embodiments, due to the small variation of the selected MTJ cells, no specific resistive element (i.e., one having high resistance value) is needed. Accordingly, the area occupied by the reference cells is reduced.

The configurations of FIG. 7 are given for illustrative purposes. Various implements are within the contemplated scope of the present disclosure. For example, in some embodiments, the reference cells RC are coupled to different groups of reference word lines RWL1-RWLk. Specifically, for instance, one switch 42 coupled to the reference word line RWL1 is turned on to couple a MTJ cell 41 to the data line RL1 in the reference cell RC coupled to the multiplexer MUX1, while another switch 42 coupled to the reference word line RWLk (i.e., k does not equal to 1) is turned on to couple a MTJ cell 41 to the data line RLz in the reference cell RC coupled to the multiplexer MUXm. Alternatively stated, switches in different rows are turned on in some embodiments.

Figure 8:
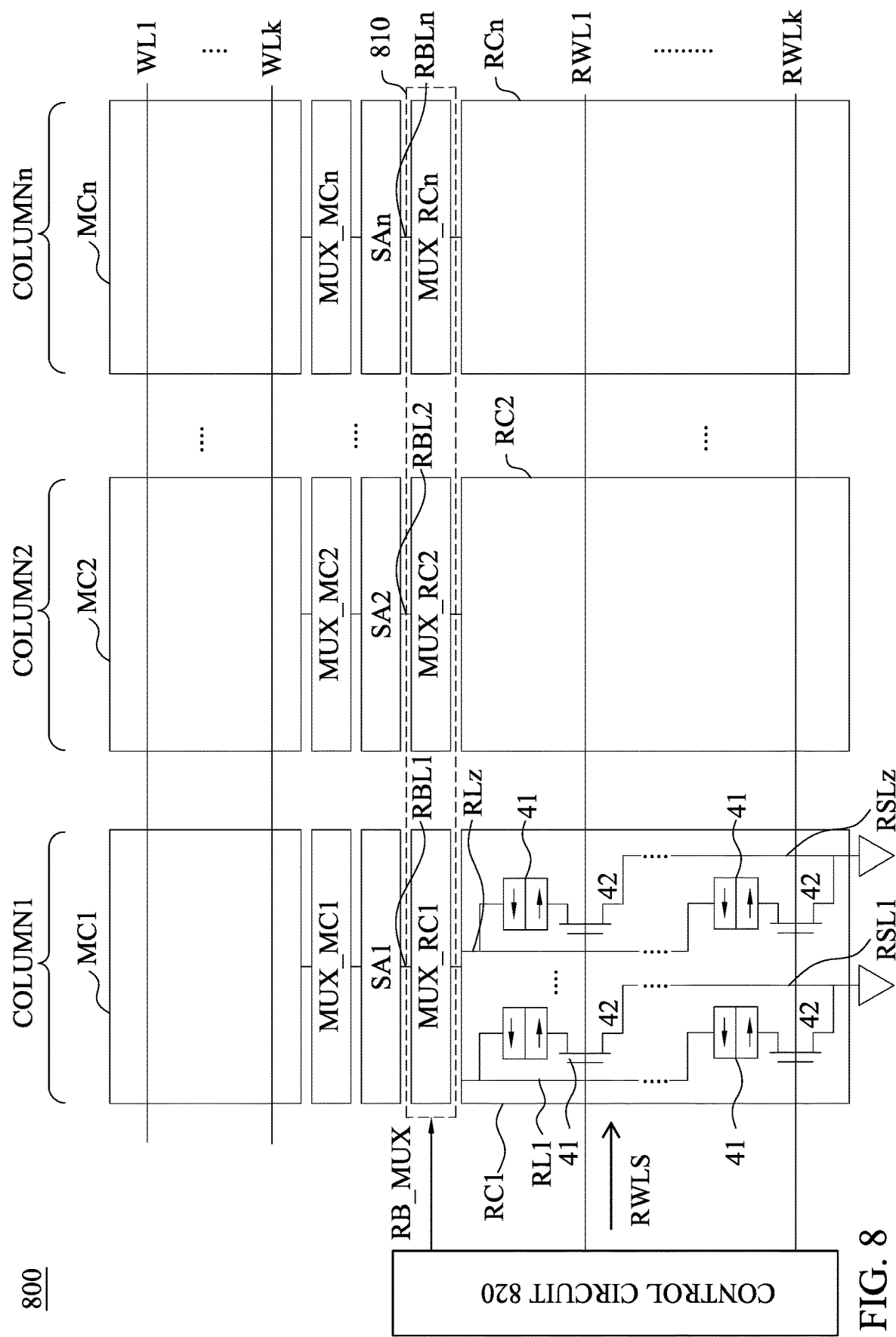
FIG. 8 is a schematic diagram of a memory device in accordance with various embodiments of the present disclosure.

Reference is now made to FIG. 8. FIG. 8 is a schematic diagram of a memory device 800 in accordance with other embodiments of the present disclosure. With respect to the embodiments of FIGS. 1-7, like elements in FIG. 8 are designated with the same reference numbers for ease of understanding.

For illustration, the memory device 800 includes multiple memory columns COLUMN1-COLUMNn. The memory columns COLUMN1-COLUMNn include memory cell blocks MC1-MCn, multiplexers MUX_MC1-MUX_MCn, sense amplifiers SA1-SAn, multiplexers MUX_RC1-MUX_RCn included in a data line controller 810, reference cells RC1-RCn, and a control circuit 820. In some embodiments, the memory cell blocks MC1-MCn are configured with respect to, for example, the memory cell block MCB of FIG. 1. The sense amplifiers SA1-SAn are configured with respect to, for example, the sense amplifiers SA1-SAn of FIG. 1. The reference cells RC1-RCn are configured with respect to, for example, the reference cells RC of FIG. 7, and the reference cells RC1-RCn have the same configurations. The multiplexers MUX_RC1-MUX_RCn are configured with respect to, for example, the multiplexers MUX1-MUXn of FIG. 7.

The multiplexers MUX_MC1-MUX_MCn are coupled between the memory cell blocks MC1-MCn and the sense amplifiers SA1-SAn, and configured to select one memory cell RC in each of the memory cell blocks MC1-MCn in response to control signals that address word lines WL1-WKk and enable read operations for transmitting cell currents to the sense amplifiers SA1-SAn.

The multiplexers MUX_RC1-MUX_RCn included in the data line controller 810 are coupled between the sense amplifiers SA1-SAn and the reference cells RC1-RCn. The data line controller 810 is configured to receive a select signal RB_MUX. In some embodiments, the select signal RB_MUX includes multiple select signals RB_MUX1-RB_MUXn for the multiplexers MUX_RC1-MUX_RCn separately. Accordingly, the multiplexers MUX_RC1-MUX_RCn select, in response to the select signals RB_MUX1-RB_MUXn, one of the data lines RL1-RLz in each of reference cells RC1-RCn to be coupled to the sense amplifiers SA1-SAn. For example, in some embodiments, the multiplexer MUX_RC1 selects, in response to the select signal RB_MUX1, the data line RL1 and couples the data line RL1 to the sense amplifier SA1 through the data line RBL1. The configurations of the multiplexers MUX_RC2-MUX_RCn are similar to that of the multiplexer MUX_RC1. Therefore, the repetitious descriptions are omitted here.

The configurations of the reference cells RC1-RCn are similar to that of the reference cells RC in FIG. 7. Therefore, the repetitious descriptions are omitted here.

With continued reference to FIG. 8, the control circuit 820 is configured to generate the select signal RB_MUX (i.e., the select signals RB_MUX1-RB_MUXn) and reference word line signal RWLS (for addressing the reference word lines RWL1-RWLk) based on a minimum variation of resistance values of the reference cells RC1-RCn. For example, in some embodiments, a resistance value of each MTJ cells 41 in the reference cells RC1-RCn is known. Based on the resistance values of the MTJ cells 41, a combination of MTJ cells 41 having a minimum variation of resistance values is obtained through selecting a specific MTJ cell 41 in each of the reference cells RC1-RCn. Accordingly, the control circuit 820 generates the select signals RB_MUX1-RB_MUXn to the multiplexers MUX_RC1-MUX_RCn to select the corresponding data line coupled to the selected MTJ cell 41, and further generates the reference word line signals RWLS to turn on a switch 42 coupled to the selected MTJ cell 41. In such embodiments, the resistance variation of the reference cells is tightened.

In some approaches, a resistance variation of reference cells is about 5% for $1\sigma$. With the configurations of the present disclosure, when n equals to 36 (i.e., 36 memory columns in the memory device 800) and z equals to 1 (i.e., 1 data line RL1 in each of the reference cell RC1-RC36), the resistance variation is about 0.58% for $1\sigma$ and 2.3% for $4\sigma$, in some embodiments. When n equals to 36 and z equals to 2, the resistance variation is about 0.34% for $1\sigma$ and 1.37% for $4\sigma$. When n equals to 36 and z equals to 4, the resistance variation is about 0.20% for $1\sigma$ and 0.82% for $4\sigma$. When n equals to 36 and z equals to 8, the resistance variation is about 0.11% for $1\sigma$ and 0.47% for $4\sigma$. When n equals to 36 and z equals to 16, the resistance variation is about 0.06% for $1\sigma$ and 0.25% for $4\sigma$. Based on the discussion above, the multiple choices provided by the reference cells RC1-RCn reduces the resistance variation of the reference cells.

The configurations of FIG. 8 are given for illustrative purposes. Various implements are within the contemplated scope of the present disclosure. For example, in some embodiments, the reference cells RC1-RCn are coupled to different groups of reference word lines RWL1-RWLk. Specifically, for instance, one switch 42 coupled to the reference word line RWL1 is turned on to couple a MTJ cell 41 to the data line RL1 in the reference cell RC1, and another switch 42 coupled to the reference word line RWLk (i.e., k does not equal to 1) is turned on to couple a MTJ cell 41 to the data line RLz in the reference cell RC2. Alternatively stated, switches in different rows are turned on in some embodiments. Furthermore, in various embodiments, the number of the word lines WL1-WLk is different from the number of the reference word lines RWL1-RWLk.

Figure 9:
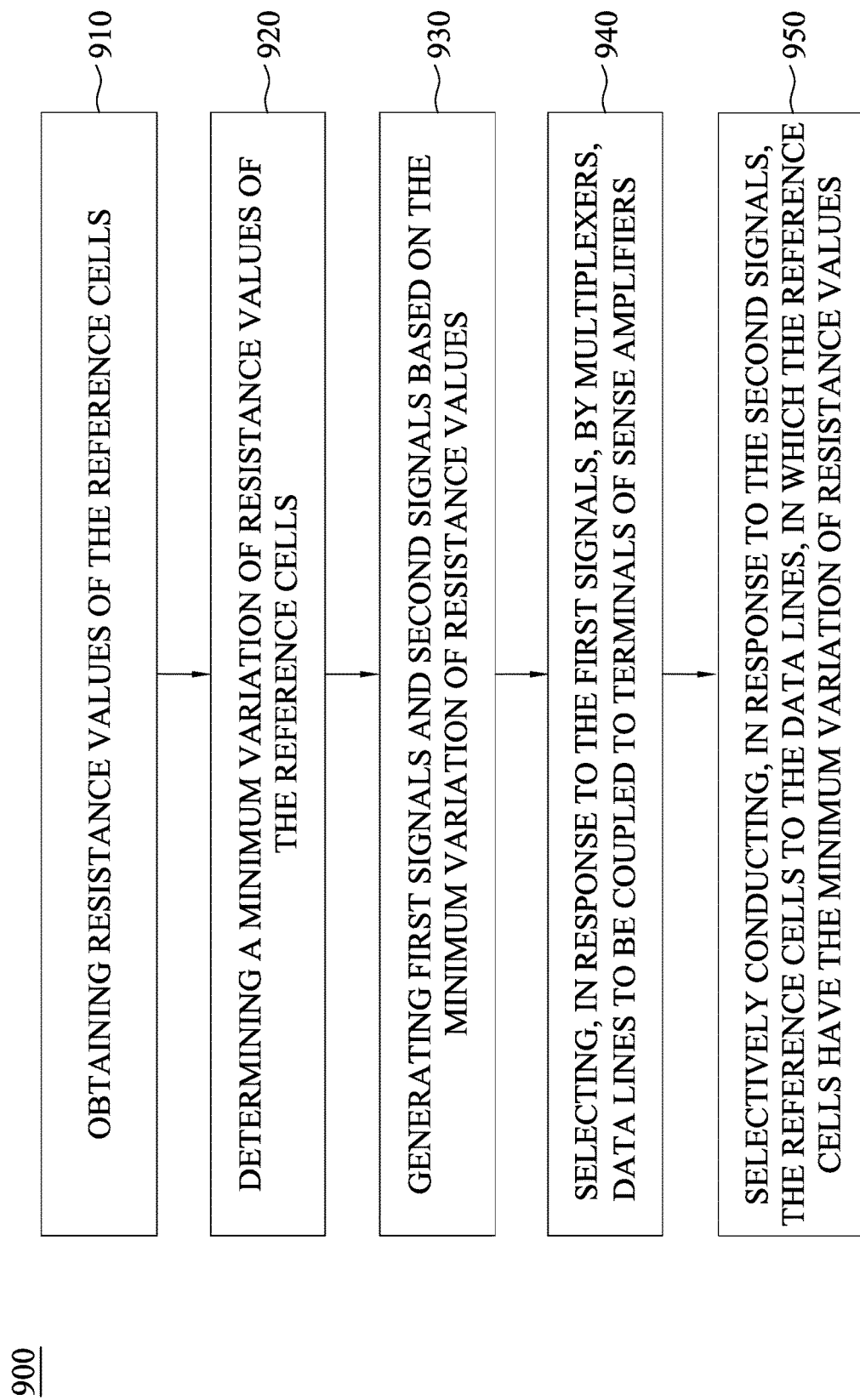
FIG. 9 is a flowchart of a method, in accordance with some embodiments of the present disclosure.

Reference is now made to FIG. 9. FIG. 9 is a flowchart of a method 900, in accordance with some embodiments of the present disclosure. It is understood that additional operations can be provided before, during, and after the processes shown by FIG. 9, and some of the operations described below can be replaced or eliminated, for additional embodiments of the method. The order of the operations/processes may be interchangeable. Throughout the various views and illustrative embodiments, like reference numbers are used to designate like elements. The method 900 includes operations 910-950 that are described below with reference to the memory device 800 of FIG. 8.

In operation 910, resistance values of the reference cells RC1-RCn are obtained. In some embodiments, the resistance values of the MTJ cells 41 are obtained after manufacture and are stored in the control circuit 820.

In operation 920, the minimum variation of the resistance values of the reference cells RC1-RCn is determined. For example, as discussed with reference to FIG. 8 above, by selecting a specific MTJ cell 41 in each of the reference cells RC1-RCn, a combination of MTJ cells 41 having the minimum variation of resistance values is obtained, in some embodiments.

In operation 930, based on the minimum variation of resistance values contributed by the combination of specific MTJ cells 41, the control circuit 820 generates the select signal RB_MUX (i.e., the select signals RB_MUX1-RB_MUXn) and the reference word line signals RWLS for the reference word lines RWL1-RWLk.

In operation 940, the multiplexers MUX_RC1-MUX_RCn select separately, in response to the select signals RB_MUX1-RB_MUXn, one of the data lines RL1-RLz in each of the reference cells RC1-RCn to be coupled to a terminal of the sense amplifiers SA1-SAn.

In operation 950, the switches 42 selectively conduct, in response to the reference word line signals RWLS, the selected MTJ cells 41 to the corresponding one data line in the reference cells RC1-RCn. In some embodiments, the selected MTJ cells have the minimum variation of resistance values.

In some embodiments, as shown in FIG. 7, the multiplexers MUX1-MUXn are coupled at the nodes n1, nm, or nn. Alternatively stated, the multiplexers MUX1-MUXn are coupled at the second terminals of the sense amplifiers SA1-SAn.

In some embodiments, the operation of selectively conducting the selected MTJ cells 41 to the corresponding one data line includes conducting, by one switch 42 coupled to the reference word line RWL1, a corresponding MTJ cell 41 in the reference cell RC1 to the multiplexer MUX1, and conducting, by another switch 42, coupled to the reference word line RWLk (i.e., k does not equal to 1), a corresponding MTJ cell 41 in the reference cell RC2 to the multiplexer MUX2.

As described above, the memory device in the present disclosure provides multiple choices of reference cells for sense amplifiers to select desired reference cells among all reference cells, in which those selected reference cells contribute reduced resistance variation. Accordingly, IO-to-IO variation and IC area occupied by the memory device are reduced at the same time.

In some embodiments, a memory device is disclosed. The memory device includes several sense amplifiers and at least one reference cell. Each of the sense amplifiers has a first terminal and a second terminal. The first terminals of the sense amplifiers are coupled to a memory cell block, and the second terminals of the sense amplifiers are coupled together to transmit a read current. The at least one reference cell transmits the read current to a ground terminal. The at least one reference cell has a decreased resistance value when a number N of the sense amplifiers increases. In some embodiments, currents transmitted by the second terminals of the sense amplifiers according to the read current are the same. In some embodiments, the memory cell block includes multiple data cells having a first resistance value r1 corresponding to a low logic state and a second resistance value r2 corresponding to a high logic state. The at least one reference cell has a resistance value of $(r1+r2)/2N$. In some embodiments, the at least one reference cell includes multiple reference cells. The second terminal of each of the sense amplifiers is coupled to one of the reference cells. In some embodiments, a M-th sense amplifier of the sense amplifier is coupled to the at least one reference cell through a data line, M being larger than 1 and smaller than the number N. The M-th sense amplifier is arranged closest to the at least one reference cell compared with the others in the sense amplifiers. In some embodiments, the at least one reference cell include multiple reference cells. The memory device further includes a multiplexer coupled between first terminals of the reference cells and the second terminals of the sense amplifiers. second terminals of the reference cells are coupled to a ground. In some embodiments, the multiplexer is configured to couple, in response to a select signal, the sense amplifiers to a selected one of the reference cells. In some embodiments, the at least one reference cell includes multiple reference cells. The memory device further includes multiple multiplexers each coupled between one of the sense amplifier and a portion of the reference cells. Each of the multiplexers is configured to couple, in response to one of multiple select signals, one of the reference cells to the second terminal of one of the sense amplifiers. In some embodiments, the at least one reference cell includes multiple reference cells each including at least one magnetic tunnel junction (MTJ) memory cell and a transistor coupled thereto. The transistor couples, in response to a word line signal, the at least one magnetic tunnel junction memory cell to one of multiple multiplexers. In some embodiments, the at least one reference cell further includes multiple reference cells. The memory device further includes a multiplexer coupled between the reference cells and the second terminal of a first sense amplifier of the sense amplifier. the multiplexer is configured to select, in response to a select signal, one of the reference cells. The reference cells, the multiplexer, and the first sense amplifier are included in a memory column, and the memory device further includes multiple the memory columns.

Also disclosed is a memory device that includes multiple data cells and at least one reference cell, in which the data cells have a first resistance value corresponding to a low logic state and a second resistance value corresponding to a high logic state; and multiple sense amplifiers each configured to compare a first signal from a corresponding cell in the data cells with a second signal from the at least one reference cell. A resistance of the at least one reference cell is associated a ratio of a sum of the first and second resistance values over a number of the sense amplifiers. In some embodiments, the resistance of the at least one reference cell is in inverse ratio to the number of the sense amplifiers. In some embodiments, the at least one reference cell includes multiple reference cells. The memory device further includes a multiplexer coupled between the sense amplifiers and the reference cells. The multiplexer is configured to electrically couple, in response to a select signal, one of the reference cells to the sense amplifiers. In some embodiments, the at least one reference cell includes multiple reference cells coupled in parallel between a ground and first terminals of the sense amplifiers by a conductive line. Second terminals of the sense amplifier are coupled to the data cells. In some embodiments, the at least one reference cell includes multiple reference cells. The memory device further includes multiple multiplexers each coupled to one of the sense amplifiers through multiple first data lines, and each coupled to a portion of the reference cells through multiple second data lines. Each of the multiplexers is configured to selectively couple, in response to one of multiple first signals, a first line of the second data lines to a corresponding one of the first data lines. In some embodiments, one of the reference cells is further coupled to, in response to a second signal, the first line of the second data lines.

Also disclosed is a method that includes the operation below: In some embodiments, the method further includes obtaining the resistance values of the reference cells; and generating the first signals and the second signals based on the minimum variation of resistance values of the reference cells. In some embodiments, the connection line is coupled between the sense amplifiers and multiple multiplexers that are coupled to the first data lines. In some embodiments, a first cell, in a first row, of the reference cells is coupled to a first multiplexer of the multiplexers while a second cell, in a second row, of the reference cells is disconnected from a second multiplexer of the multiplexers. The first cell is arranged closer to the sense amplifiers than the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of sense amplifiers each having a first terminal and a second terminal, wherein the first terminals of the plurality of sense amplifiers are coupled to a memory cell block, and the second terminals of the plurality of sense amplifiers are coupled together to transmit a read current; and
   at least one reference cell configured to transmit the read current to a ground terminal, wherein the at least one reference cell has a decreased resistance value when a number N of the plurality of sense amplifiers increases.

2. The memory device of claim 1, wherein currents transmitted by the second terminals of the plurality of sense amplifiers according to the read current are the same.

3. The memory device of claim 1, wherein the memory cell block comprises a plurality of data cells having a first resistance value r1 corresponding to a low logic state and a second resistance value r2 corresponding to a high logic state;
   wherein the at least one reference cell has a resistance value of (r1+r2)/2N.

4. The memory device of claim 1, wherein the at least one reference cell comprises:
   a plurality of reference cells, wherein the second terminal of each of the plurality of sense amplifiers is coupled to one of the plurality of reference cells.

5. The memory device of claim 1, wherein a M-th sense amplifier of the plurality of sense amplifiers is coupled to the at least one reference cell through a data line, M being larger than 1 and smaller than the number N,
   wherein the M-th sense amplifier is arranged closest to the at least one reference cell compared with the others in the plurality of sense amplifiers.

6. The memory device of claim 1, wherein the at least one reference cell comprises:
   a plurality of reference cells;
   wherein the memory device further comprises:
      a multiplexer coupled between first terminals of the plurality of reference cells and the second terminals of the plurality of sense amplifiers, wherein second terminals of the plurality of reference cells are coupled to a ground.

7. The memory device of claim 6, wherein the multiplexer is configured to couple, in response to a select signal, the plurality of sense amplifiers to a selected one of the plurality of reference cells.

8. The memory device of claim 1, wherein the at least one reference cell comprises:
a plurality of reference cells;
wherein the memory device further comprises:
a plurality of multiplexers each coupled between one of the plurality of sense amplifiers and a portion of the plurality of reference cells,
wherein each of the plurality of multiplexers is configured to couple, in response to one of a plurality of select signals, one of the plurality of reference cells to the second terminal of one of the plurality of sense amplifiers.

9. The memory device of claim 1, wherein the at least one reference cell comprises a plurality of reference cells each comprising:
at least one magnetic tunnel junction (MTJ) memory cell and a transistor coupled thereto;
wherein the transistor couples, in response to a word line signal, the at least one magnetic tunnel junction memory cell to one of a plurality of multiplexers.

10. The memory device of claim 1, wherein the at least one reference cell further comprises:
a plurality of reference cells;
wherein the memory device further comprises:
a multiplexer coupled between the plurality of reference cells and the second terminal of a first sense amplifier of the plurality of sense amplifiers, wherein the multiplexer is configured to select, in response to a select signal, one of the plurality of reference cells;
wherein the plurality of reference cells, the multiplexer, and the first sense amplifier are included in a memory column, and the memory device further comprises a plurality of the memory columns.

11. A memory device, comprising:
a plurality of data cells and at least one reference cell, wherein the plurality of data cells have a first resistance value corresponding to a low logic state and a second resistance value corresponding to a high logic state; and
a plurality of sense amplifiers each configured to compare a first signal from a corresponding cell in the plurality of data cells with a second signal from the at least one reference cell,
wherein a resistance of the at least one reference cell is associated a ratio of a sum of the first and second resistance values over a number of the plurality of sense amplifiers.

12. The memory device of claim 11, wherein the resistance of the at least one reference cell is in inverse ratio to the number of the plurality of sense amplifiers.

13. The memory device of claim 11, wherein the at least one reference cell comprises:
a plurality of reference cells;
wherein the memory device further comprises:
a multiplexer coupled between the plurality of sense amplifiers and the plurality of reference cells, wherein the multiplexer is configured to electrically couple, in response to a select signal, one of the plurality of reference cells to the plurality of sense amplifiers.

14. The memory device of claim 11, wherein the at least one reference cell comprises:
a plurality of reference cells coupled in parallel between a ground and first terminals of the plurality of sense amplifiers by a conductive line,
wherein second terminals of the plurality of sense amplifiers are coupled to the plurality of data cells.

15. The memory device of claim 11, wherein the at least one reference cell comprises:
a plurality of reference cells;
wherein the memory device further comprises:
a plurality of multiplexers each coupled to one of the plurality of sense amplifiers through a plurality of first data lines, and each coupled to a portion of the plurality of reference cells through a plurality of second data lines,
wherein each of the plurality of multiplexers is configured to selectively couple, in response to one of a plurality of third signals, a first line of the plurality of second data lines to a corresponding one of the plurality of first data lines.

16. The memory device of claim 15, wherein one of the plurality of reference cells is further coupled to, in response to a fourth signal, the first line of the plurality of second data lines.

17. A method, comprising:
selectively switching on a plurality of transistors, each coupled to a corresponding one of a plurality of reference cells, to couple to a plurality of first data lines, wherein portions of the plurality of transistors in a same row are coupled to a corresponding one of a plurality of first signals; and
selecting, in responses to a plurality of second signals, the plurality of first data lines to be coupled to first terminals of a plurality of sense amplifiers, wherein the first terminals of the plurality of sense amplifiers are connected with each other by a connection line.

18. The method of claim 17, further comprising:
obtaining resistance values of the plurality of reference cells; and
generating the plurality of first signals and the plurality of second signals based on a minimum variation of resistance values of the plurality of reference cells.

19. The method of claim 17, wherein the connection line is coupled between the plurality of sense amplifiers and a plurality of multiplexers that are coupled to the plurality of first data lines.

20. The method of claim 19, wherein a first cell, in a first row, of the plurality of reference cells is coupled to a first multiplexer of the plurality of multiplexers while a second cell, in a second row, of the plurality of reference cells is disconnected from a second multiplexer of the plurality of multiplexers,
wherein the first cell is arranged closer to the plurality of sense amplifiers than the second cell.

* * * * *